United States Patent [19]

Braden

[11] 4,406,373
[45] Sep. 27, 1983

[54] MEANS AND METHOD FOR TESTING AND SORTING MINIATURE ELECTRONIC UNITS

[75] Inventor: Denver Braden, Carlsbad, Calif.

[73] Assignee: Palomar Systems & Machines, Inc., Escondido, Calif.

[21] Appl. No.: 289,320

[22] Filed: Aug. 3, 1981

[51] Int. Cl.³ .............................................. B07C 5/344
[52] U.S. Cl. .................................... 209/574; 209/644; 209/909; 209/936; 324/158 F
[58] Field of Search .............. 209/936, 573, 574, 571, 209/644, 909; 324/158 D, 158 F, 158 P, 158 T, 60 C, 60 CD, 62 R

[56] References Cited

U.S. PATENT DOCUMENTS

| | | | |
|---|---|---|---|
| 3,366,235 | 1/1968 | Boyd et al. | 209/573 |
| 3,915,850 | 10/1975 | Crownover | 209/573 X |
| 3,931,892 | 1/1976 | Sklena et al. | 209/573 X |
| 3,969,229 | 7/1976 | Horner | 209/573 |
| 4,038,599 | 7/1977 | Bove et al. | 324/158 F |

Primary Examiner—Robert B. Reeves
Assistant Examiner—Donald Hajec
Attorney, Agent, or Firm—Oliver D. Olson

[57] ABSTRACT

System of testing and sorting according to tested ranges of values of miniature electronic capacitor and resistor units. A planar carrier with rows and files of openings, loaded with such units, is disposed in an oblique plane to retain the units in place. The carrier is moved in a stepped manner past an electrical testing station and past a series of sorting stations. At the testing station, a file of probes is brought into electrical contact with one end of a set of electronic units in each file. A metal ply laminated in the carrier contacts the other end of the set of electronic units. A bridge network makes measurements by connecting to the file of probes and to the metal ply. A receptacle is disposed at each sorting station. As each file of electronic units passes the receptacles, the units are selectively deposited in the receptacles, by air jets, according to tested ranges of values.

34 Claims, 16 Drawing Figures

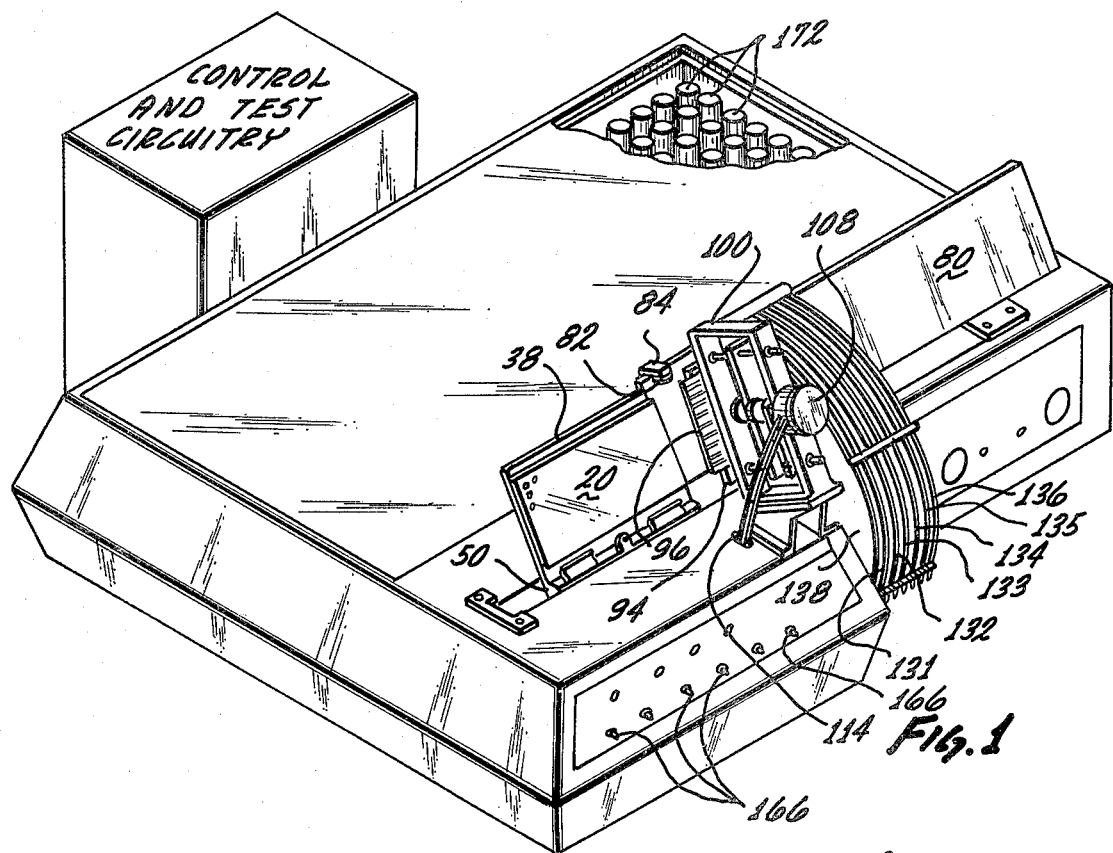
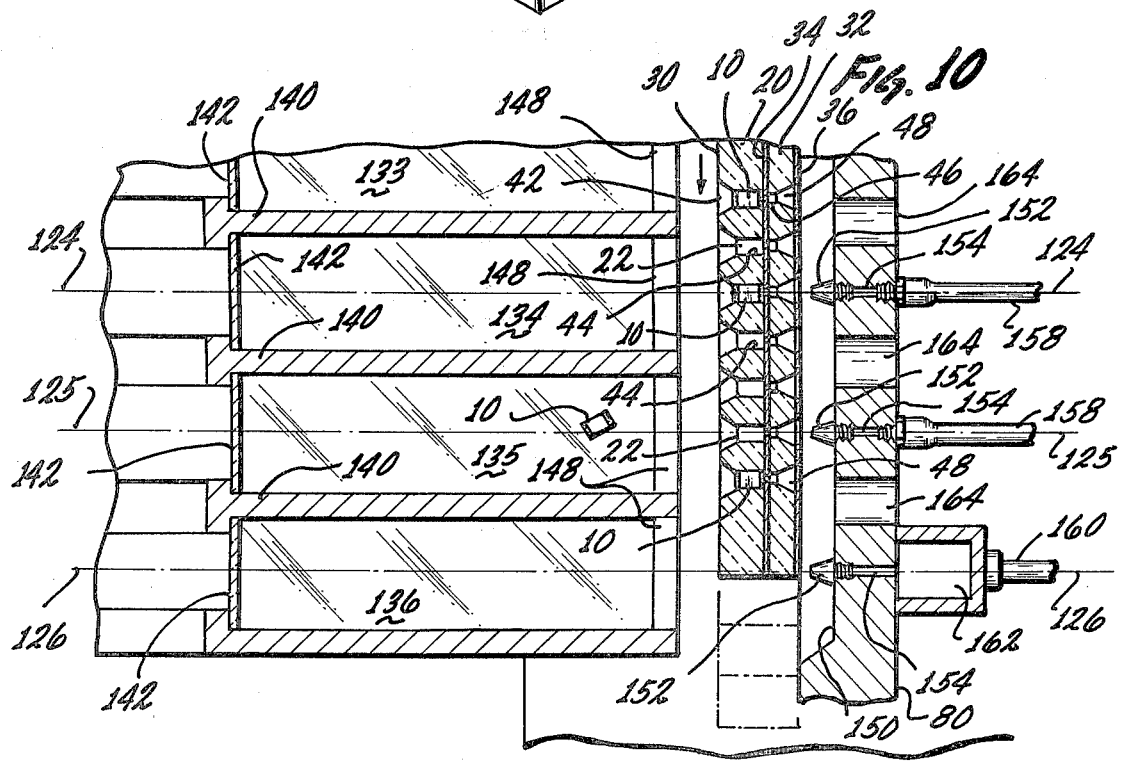

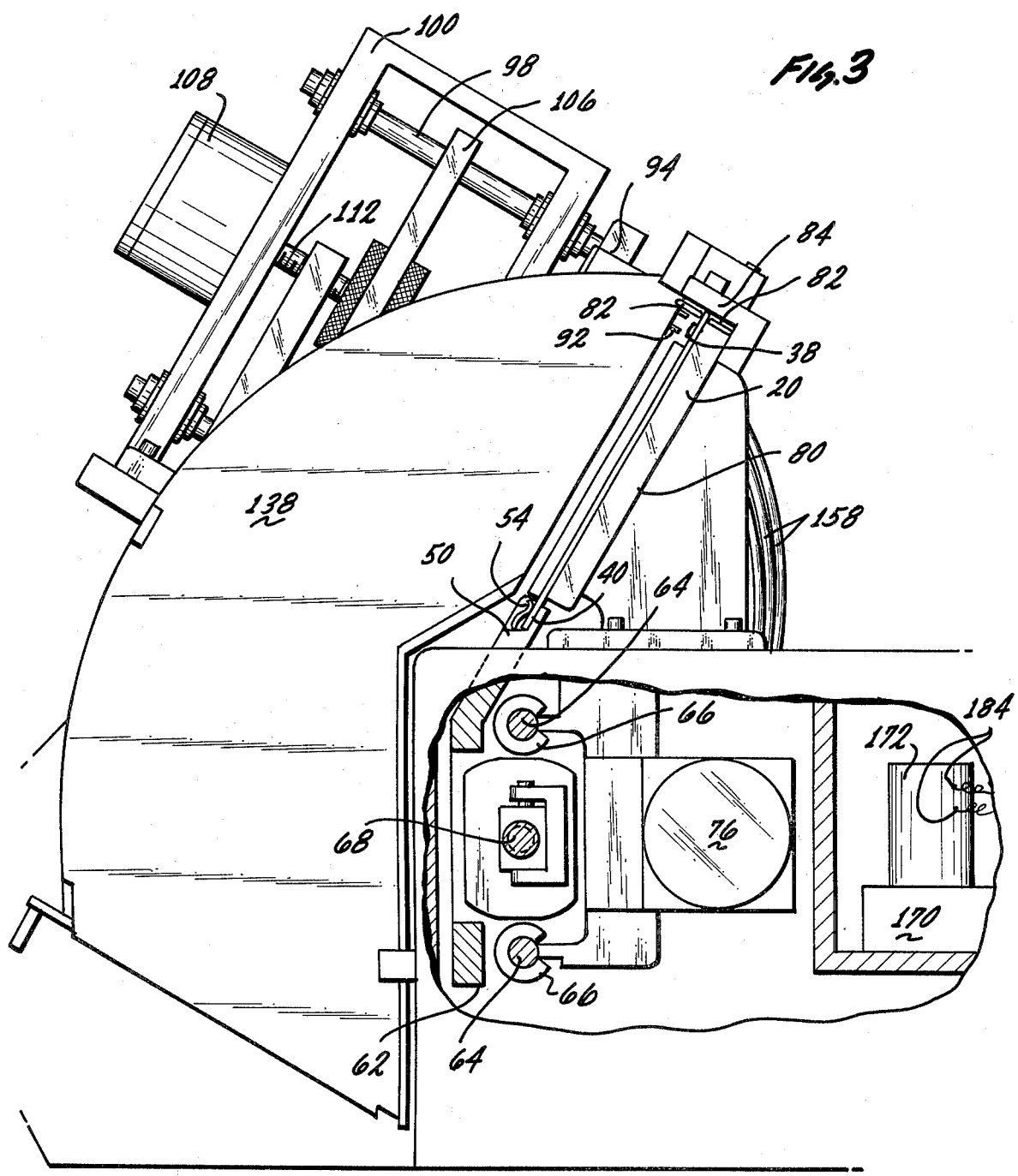

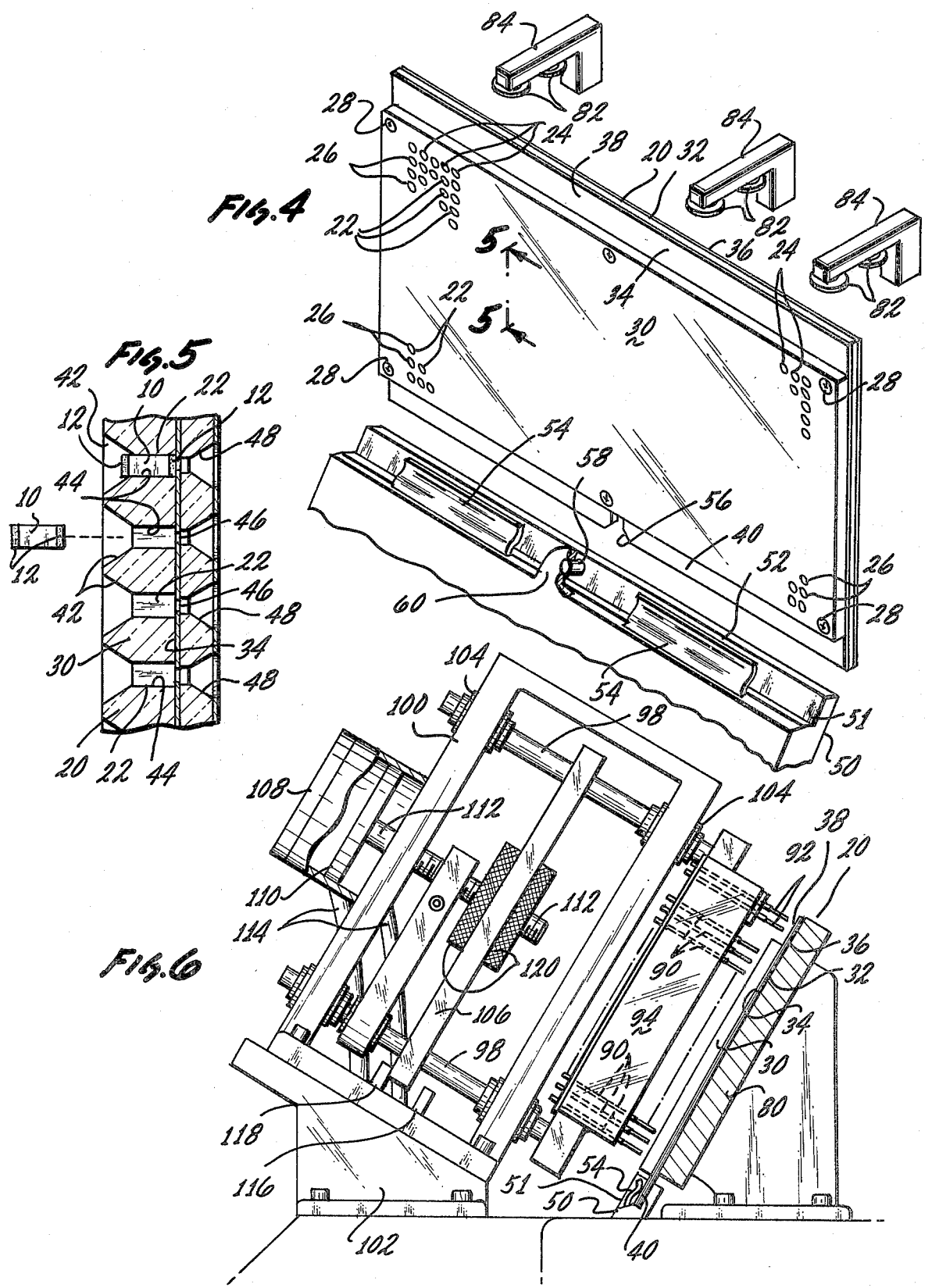

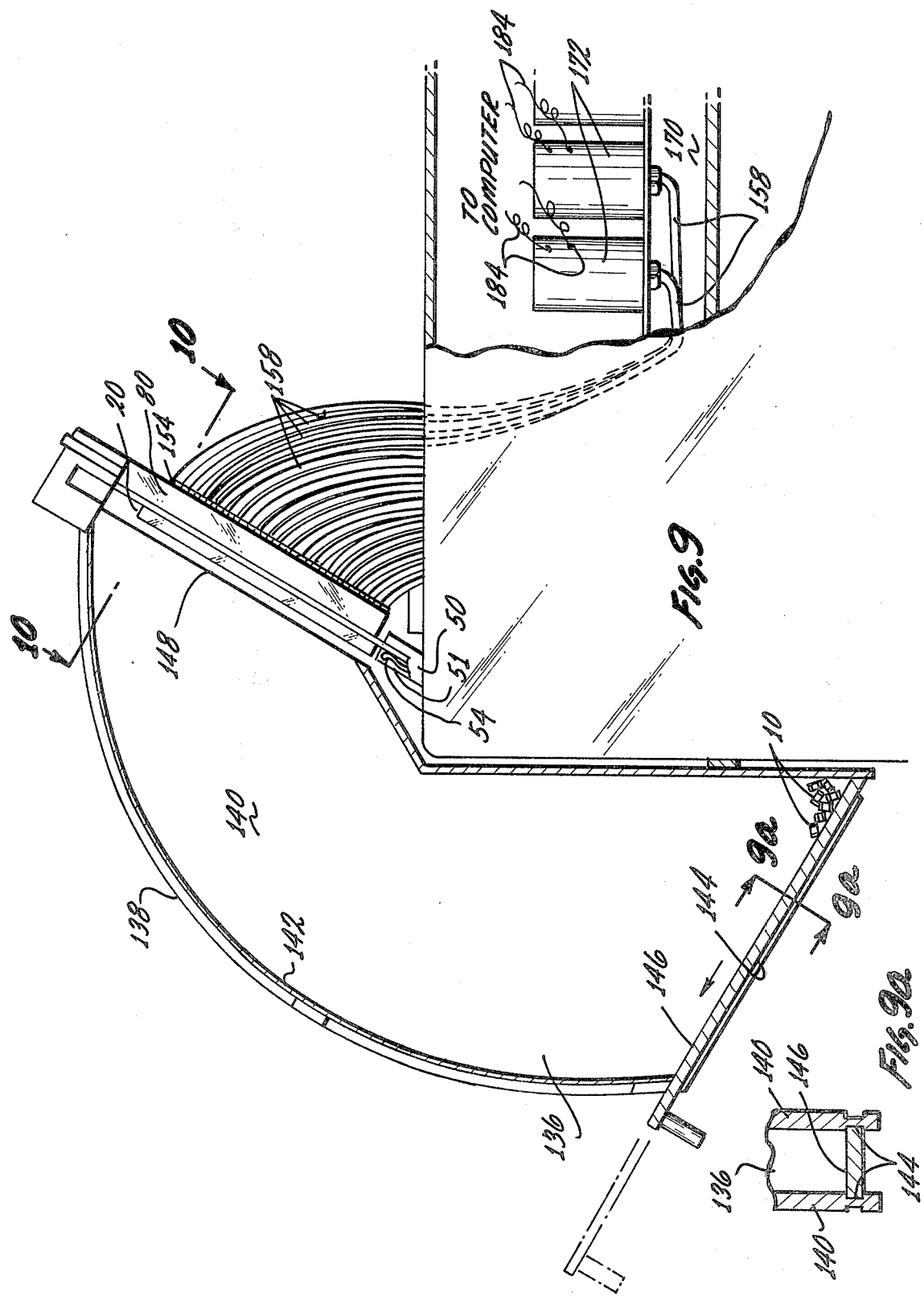

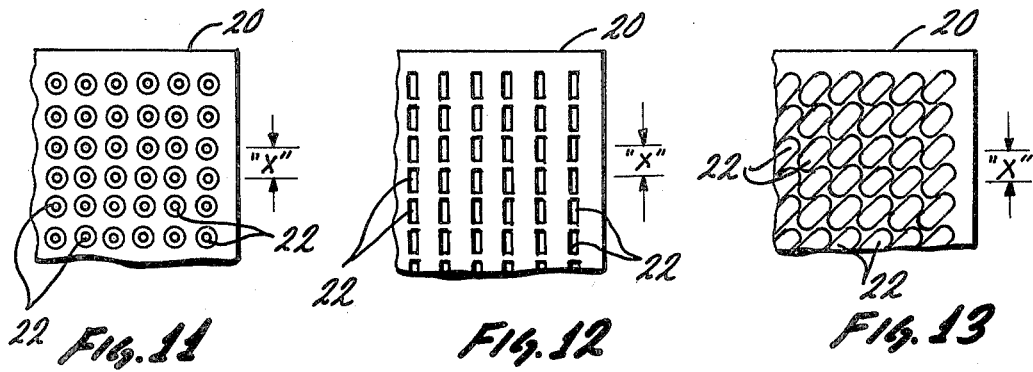
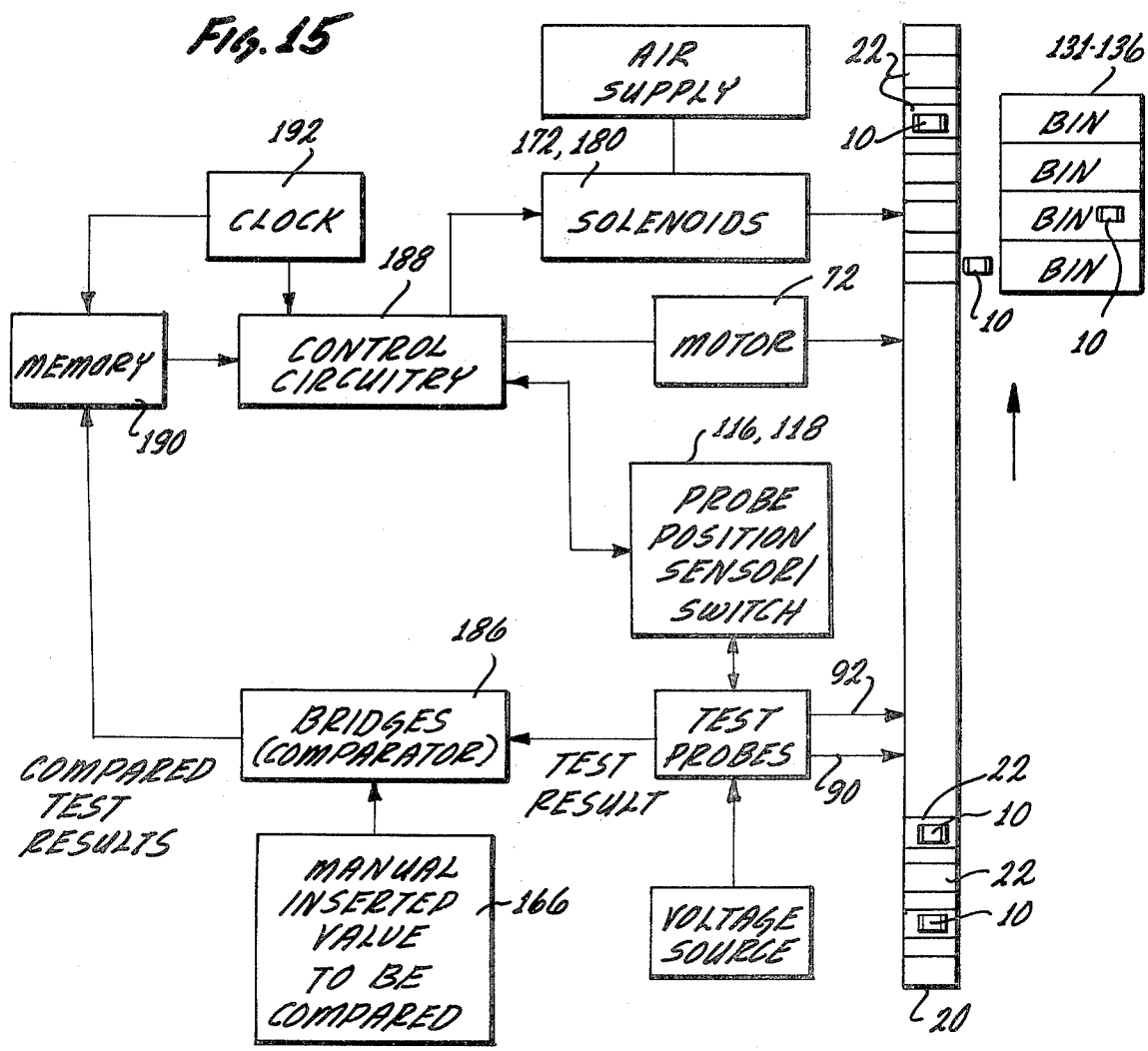

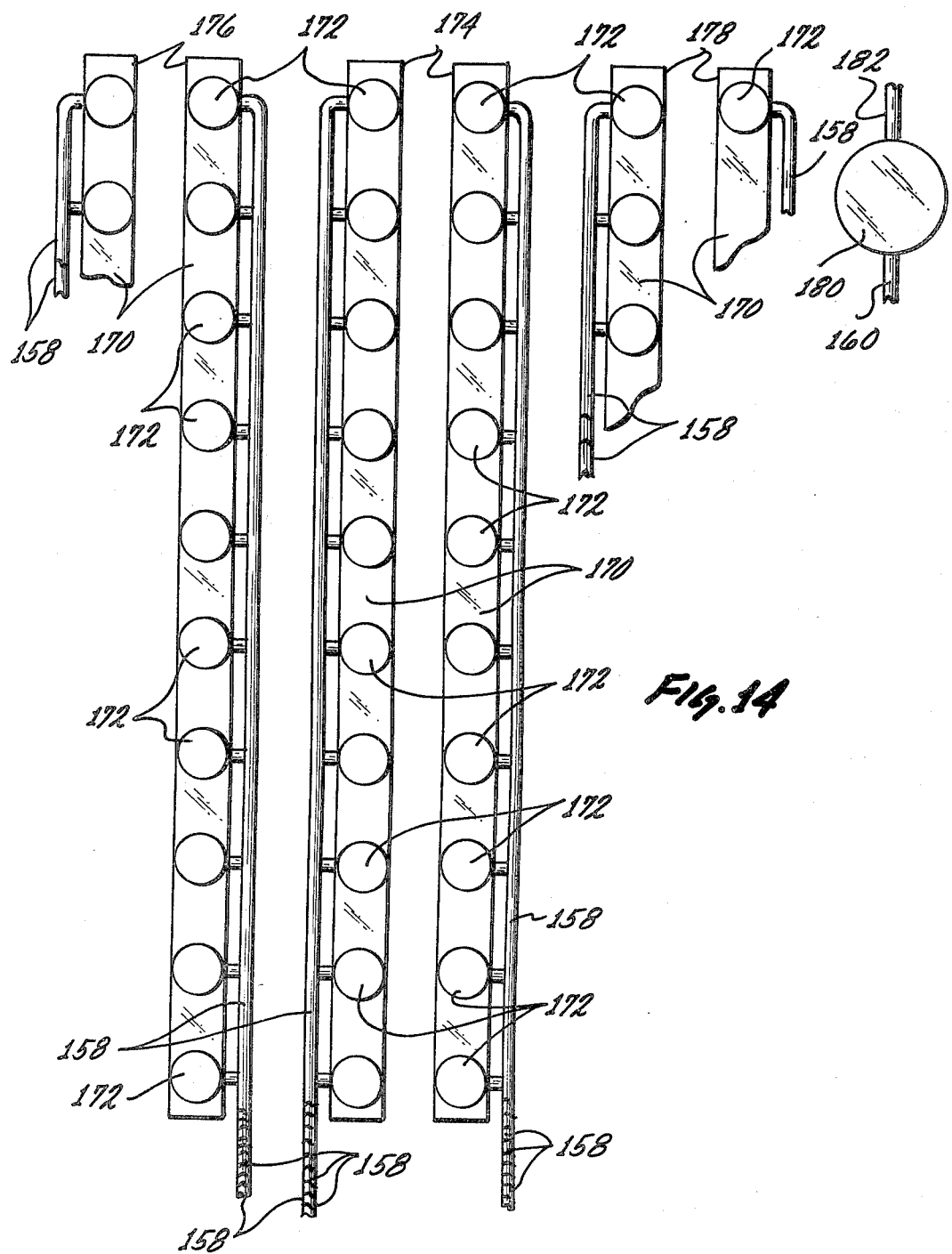

MEANS AND METHOD FOR TESTING AND SORTING MINIATURE ELECTRONIC UNITS

BRIEF SUMMARY OF THE INVENTION, BACKGROUND AND OBJECTIVES

My invention relates to testing of electrical values and to sorting according to values of miniature electronic units. These units include capacitors and resistors to be tested for capacitance values, dissipation factor values, resistance values and the like.

Such electronic units are used extensively in millions of electronic assemblies and are in growing demand. As the technology and speed in manufacturing chip capacitors and resistors has improved in recent years, a need has been generated for testing these products at a much faster and economical rate than was practiced in the past.

Due to the complex manufacturing processes involved in making chip capacitors and resistors, achieving desired values is not always accomplished and almost all chips must be tested after manufacture. There are machines commercially available to test capacitors but these machines do not operate at a rate that is compatible with present day high rates of assembly and manufacturing. The prior machines handle chips one at a time utilizing such mechanisms as vibratory feeders, vacuum pick-up mechanisms, and oscillating receptacle gates. One of the limitations of the prior machines is in handling and testing only one part at a time. It is an objective of my invention to test, classify and sort electronic units in batches. In fact, prototypes of my invention have handled, tested and categorized as high as nearly 50,000 chips per hour which is approximately five times greater than any known prior machine.

Another objective of my invention is to develop a means and a method of testing and sorting such electronic units that is simple and reliable, that reduces moving machine parts to a minimum, and that is highly accurate but may be readily adjusted to different sized and valued electronic units.

My invention will be best understood, together with additional advantages and objectives thereof, when read with reference to the drawings.

DRAWINGS

FIG. 1 is a perspective view of a specific embodiment of my system for testing and sorting miniature electronic units.

FIG. 3 is a side view, on enlarged scale, of portions of the mechanism shown in FIG. 1.

FIG. 4 is a perspective view of a plate carrier to support a bank of electronic units to be tested. A fragmentary showing is made of carrier support and guide means.

FIG. 5 is an enlarged view, primarily in section, taken on line 5-5 of FIG. 4.

FIG. 6 is a side view, partly in section, taken on line 6—6 of FIG. 2.

FIG. 9 is a view, partly in section, taken on line 9—9 of FIG. 2, showing especially a receptacle for sorted units.

FIG. 9A is an enlarged sectional view of a detail, taken on line 9A—9A of FIG. 9.

FIG. 10 is an enlarged view, partly in section, taken on line 10—10 of FIG. 9.

Figure 2:
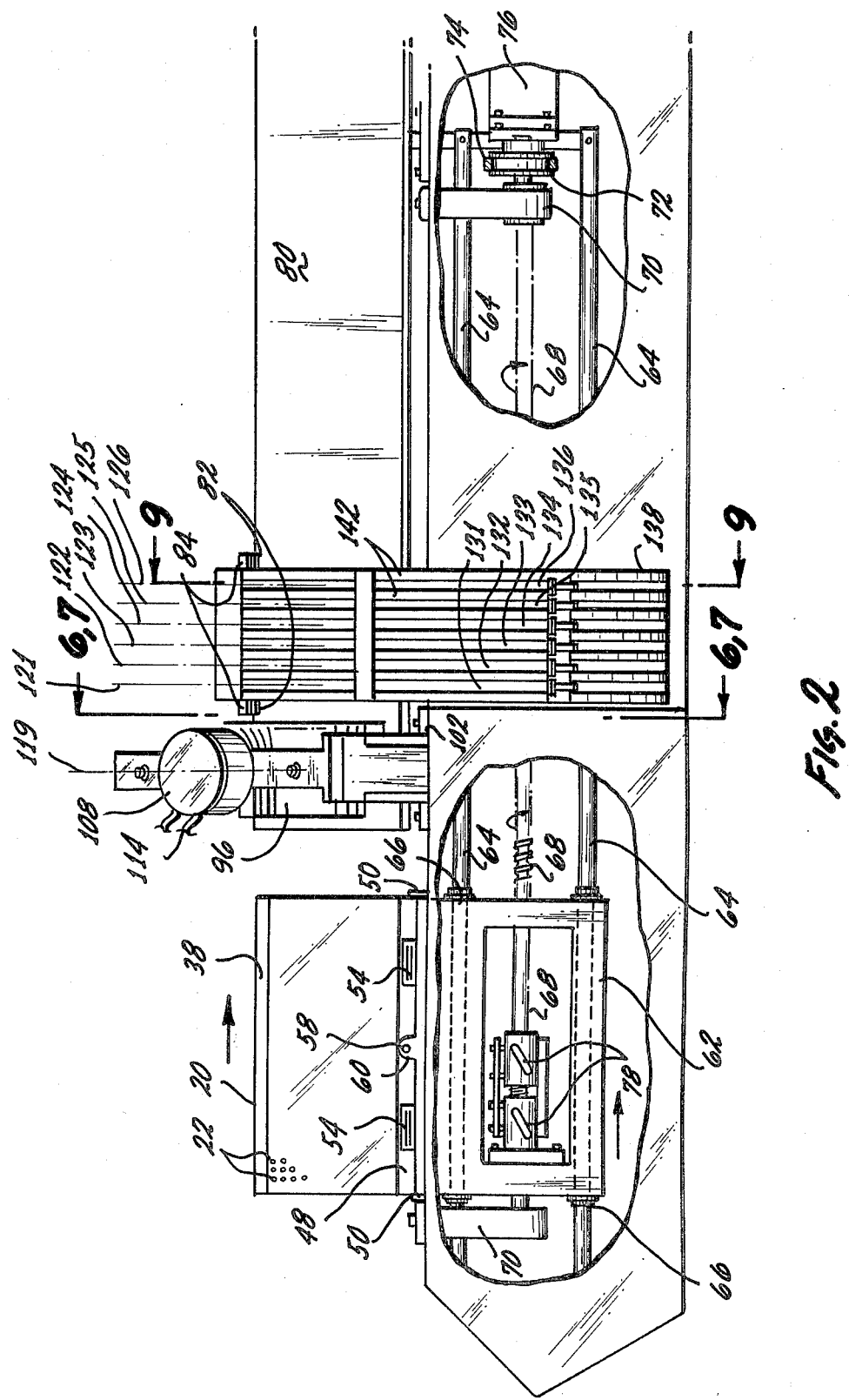
FIG. 2 is a front view of the apparatus shown in FIG. 1. Portions are broken away to show mechanisms otherwise concealed.

FIGS. 11, 12, and 13 are partial plan views of portions of carriers with three different shapes of openings to receive electronic units.

FIG. 14 is a plan view of portions of the air supply system for the apparatus.

FIG. 15 is a block diagram of the electrical testing and control system for the apparatus.

DESCRIPTION

Units 10 to be tested are primarily capacitors and resistors. These are miniature electronic parts or chips, such as monolithic chip capacitors. Such units 10 are manufactured with conductive coatings on opposite surfaces 12.

I will now describe a plate-like planar carrier 20. Plate 20 has a multiplicity of openings 22 to receive electronic units 10. Openings 22 are arranged in files 24 and rows 26.

Carrier 20 is a sandwich, that may be secured together partly by screws or bolts 28, that has an outer and an inner resin-impregnated fiberglass ply 30 and 32. In between plies 30, 32 and at the back of body 20 are metal plies 34, 36 which may be copper with a rhodium plating. Plies 30, 32 provide the basic structural qualities of the plate 20 and also are non-conductive. The medial metallic ply 34 is to establish electrical contact with the rear conductive surface 12 on each electronic unit 10. The purpose of the grounded rear ply 36 is to serve as a shield to pick up any stray electromagnetic waves. As during use carrier 20 is supported in an oblique plane, it would be appropriate to use the expression "upper and lower faces" of carrier 20 as well as the expression "front and back faces". A section of medial metal plate 34 at the top of carrier 20 is exposed at 38, to be contacted by electric probes. A recessed portion 40 at the bottom of carrier 20 is gripped by support means later to be described.

Figure 7:
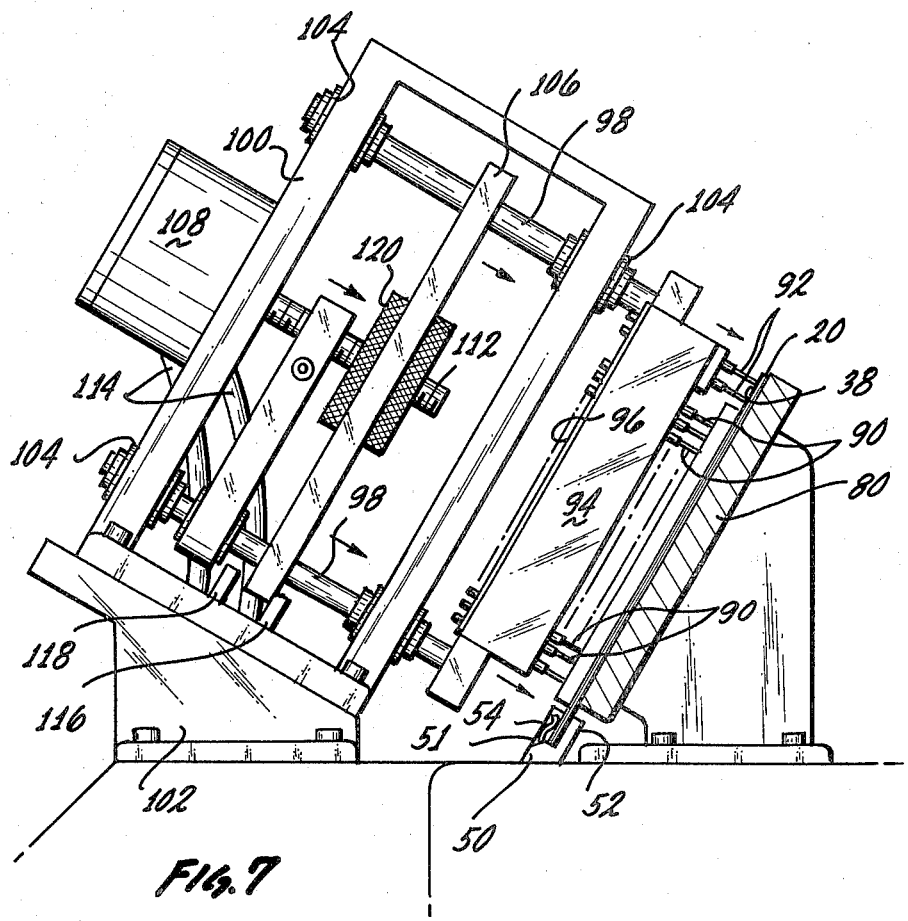
FIG. 7 is a view taken on line 7—7 of FIG. 2, which is like FIG. 6 only showing the file of electrical probes in a different position.
Figure 8:
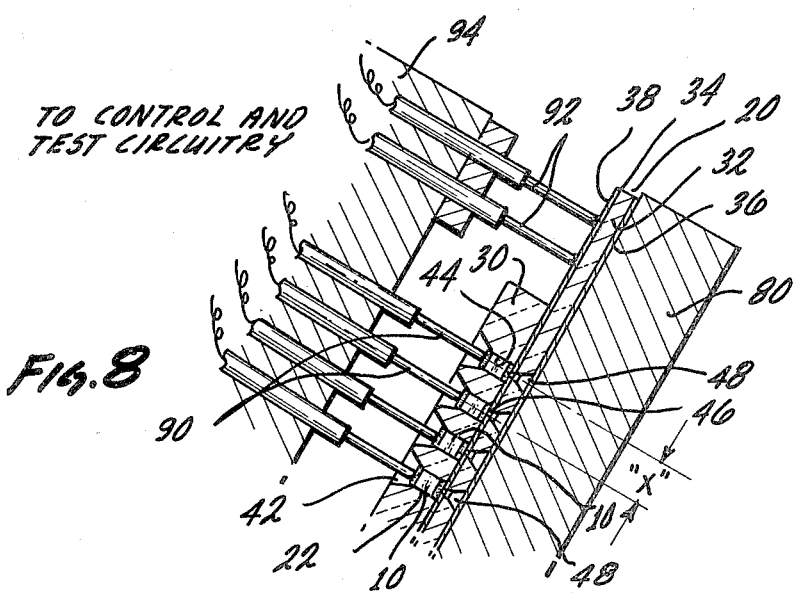
FIG. 8 is taken in the same sense as FIG. 7 but is enlarged and is limited to portions of the testing probe assembly.

The cross-sections of openings 22 are shown particularly in FIGS. 8 and 10. From front to back openings 22 include a flared entrance portion 42, a medial portion 44 loosely fitting electronic units 10, small ports 46 through medial metal ply 34, and a portion 48 on the rear side of medial ply 34 including a flared mouth, which, as will be explained later, serves to funnel air to ports 46 to blow units out of openings 22. Ports 46 are too small to pass electronic units 10. Portions of medial metal ply 34 around ports 46 serve to electrically conduct with the adjacent conductive surfaces 12 of units 10. In other words, electricity can pass from the rear conductive surface 12 of electronic units in openings 22 to metal ply 34 around ports 46 and then to the exposed top area 38 of ply 34 which is contacted by probes, as shown particularly in FIGS. 7 and 8.

It will be noted that the probes 90 shown in FIG. 8 contact units 10 in plate openings 22 and probes 90 are centered relative to openings 22. This means the probes and the openings are set apart at distances "x" from center to center, as shown in FIG. 8. Different plates 20 can be provided for different sizes and shapes of electronic units, but the different plates must have the same distance "x" between centers of openings 22 as the spacing of probes 90 or the probes must be changed as well as plates 20 to adapt to the different units 10. FIGS. 11, 12, and 13 show how the same basic spacing "x" between centers of openings 22 can be provided for different shaped and sized electronic units 10. In FIG. 11, plate 20 has openings 22 which are circular in cross-section and are spaced on center "x" distance apart. In FIG. 12, openings 22 in plate 20 are rectangular and involve more cross-sectional area, but the distance "x" between centers is preserved. It will be noted in FIG. 12 that about the maximum sized rectangles are involved as long as they are aligned with either the rows 26 or files 24 of the bank of openings 22. FIG. 13 shows how rectangular cross-sections with greater major-axes can be accommodated by disposing the openings 22 diagonally. It will be seen in FIG. 13 that openings 22 in plate 20 still are disposed "x" distance apart on center.

Openings 22 in plates 20 are filled with electronic units 10 by vibratory and/or vacuum means. Filling openings in a body with objects by use of vibration is not new with me and those skilled in the art will understand how this will be done. Reference is made for loading of a comparable plate by vibratory and vacuum means in my copending patent application Ser. No. 06/123,201, filed Feb. 21, 1980, and entitled *Means and Method for Processing Miniature Electronic Components Such as Capacitors or Resistors*. Plate 20 will be positioned in an oblique plane during testing and sorting operations. In this way, electronic units 10 will tend to stay in place, against dislodgement, due to gravity.

Probes 90, 92 preferably have the form of internally spring pressed telescoping plungers. Such plunger-type probes are on the market, and an example is the Ostby and Barton Cyclo-Soldered Test Probe. Shielding is provided in the area of probes 90, 92 and on carrier board 20 to prevent the picking up of stray capacity during operation.

The support 50 for plate carrier 20 supports the plate oriented in an oblique plane. Carriers 20 are removable and interchangable. A recess 51 in support 50 receives carriers 20, which are gripped between recess backwall 52 and a pair of spring clips 54. An indexing notch 56 in the lower edge of recessed margin 40 of plate 20 mates with a pin 58 to precisely orient plate 20 longitudinally of support 50. Pin 58 is supported at its front end by a flange 60.

Support 50 is mounted on a traveler 62 guided by a pair of guide rods 64 received in suitable bearings 66 on traveler 62. A screw rod 68 has supports 70 including bearings and connects to a pulley 72 which connects through belt 74 to the pulley (not shown) of a motor 76, which powers rotation of rod 68. Traveler 62 is connected to screw rod 68 by means including circulating ball race bearings 78. Motor 76 is a step motor which rotates a certain arc each time the current is turned on, meaning that screw 68 will be rotated a certain amount each time motor 76 advances. Traveler 62 will thus be advanced in a stepped manner from station to station, pausing at each station, during testing and sorting operations.

Plate 20 in the later part of its travel advances in front of a plate 80 that is shown particularly in FIGS. 1 and 2. Preferably backing plate 80 is spaced from the adjacent surface of carrier 20, i.e., 0.020 inches. Of course the face of backing plate 80 is disposed in a plane parallel to the oblique plane in which carrier 20 travels. Portions of carrier plate 20 are given additional guide roller support in the portion of its travel past part testing and part ejecting stations. This may be at three places: one immediately forward of probes 90 and one ahead of and one at the rear end of the part ejecting stations 121-126. The guides are in the form of pairs of rollers 82 that contact opposite sides of the upper margin of plate 20. Rollers 82 depend from supporting L-shaped arms 84 secured to plate 80.

The electrical testing means at electrical testing station 119 includes a file of electrical probes 90. In prototypes, plate carrier 20 has been constructed with forty files 24 and twenty rows 26, making a total of eight hundred openings 22 in the plate 20, meaning eight hundred electronic units 10 can be processed as a batch in a single travel of carrier 20 past testing and sorting stations. This means in the example there are twenty probes 90, i.e., one for each row 26 in a file 24 being tested. In addition to these electrical probes contacting outer conducting surfaces 12 on electronic units 10 in the file 24, two upper probes 92 contact exposed top area 38 of metal surface 34 to establish electrical contact therewith. It will be understood that if probes 90 contact the outer end of electronic units 10 and if upper probes 92 contact metal surface 34 that is in contact with the inner conductive surfaces 12 of electronic units 10 in the file 24, then electrical measurements can be made between probes 90 and probes 92, such as bridges testing capacitance values and dissipation factor value of capacitors and testing the resistance values of resistors. If units 10 are not fully seated against conductive surface 34 in openings 22 before testing, the movement of the probes 90 will press units 10 against conductive surface 34.

The file of electrical probes 90 is located at the first testing station 119 in the travel of carrier 20 from right to left as viewed in FIGS. 1 and 2. It will be understood that when a file of openings 22 reaches testing station 119 by the power of stepping motor 76 rotating screw 68, and when a file of probes 90, 92 is pressed into electrical contact with units 10 in the file and with surface 34, testing can be conducted on all twenty units in the file at one time if there are twenty bridges in the electrical testing network. Alternatively, the bridge network does not need to be duplicated for each row of openings 10 and instead a single bridge network can be used and the twenty units can be serially scanned. A separate bridge function is involved for each value, such as capacitance, dissipation factor or resistance. The control for the system will govern the dwell in testing with probes 90, 92, and it will be understood that measurements can be taken in time spans such as four hundred milliseconds.

Probes 90, 92 are mounted on a holder 94. A circuit board 96 is mounted on holder 94 and connects between probes 90, 92 and electrical leads (not shown) connecting to bridge networks, etc.

Holder 94 is supported by a pair of rods 98. A frame 100 secured to the machine by a base 102 has bearings 104 for rods 98 to guide rods 98 in extension and retraction. Force is supplied to rods 98 through a common arm 106 attached to both rods 98. An air cylinder 108 has a piston or diaphragm 110. A rod 112 attaches to piston or diaphragm 110 and to common arm 106. Air lines 114 to opposite sides of piston or diaphragm 110 force rod 112 in extension and retraction. As pressure is applied to air cylinder 108 to extend rod 112, probes 90, 92 are forced into contact with units 10 in carrier 20 and into contact with conductive surface 38 respectively. Conversely, when air pressure is applied through lines 114 to retract rod 112, probes 90, 92 are moved away from carrier 20. There are two switches 116 and 118 mounted on frame 100. Switches 116, 118 can be operated by arm 106 or by other moving parts. Switch 116 is operated when probes 90, 92 have been moved into contact with carrier 20 and signals the bridge network that measurements can be made. Switch 118 senses retraction of probes 90, 92 so that carrier 20 can be indexed or advanced to another file 24. Rod 112 is threaded and there are nuts 120 on opposite sides of common arm 106 so that the position of the file of probes 90, 92 relative to rod 112 can be adjusted.

The bank of probes 90, 92 could be moved in and out by other means than air cylinder 108, such as by an electrical solonoid, stepper motor or other mechanical or electrical device. An arm 107 is supported on one rod 98 by a linear bearing and its other split end engages threaded rod 112 and locks the position of rod 112 with a clamp locking screw 109.

As each file 24 of openings 22 in carrier 20 is advanced past the electrical testing station 119, it eventually reaches the part sorting or ejecting stations. In the prototype of my equipment there are six sorting stations 121, 122, 123, 124, 125 and 126. Each station is located midway relative to the openings 148 to receptacles 131, 132, 133, 134, 135 and 136. Each time stepper motor 76 advances and rotates screw rod 68 a given arc, plate 20 is advanced the distance between files 24 so that first each file 24 is oriented with electrical testing station 119 and then after several more advancements each file 24 reaches sorting station 121 and thereafter is advanced to stations 122, 123, 124, 125 and 126. The apparatus is controlled so that while a following file 24 is being electrically tested at station 119, units 10 in preceding files 24 are being blown into various receptacles or receivers 131-136 at the various sorting stations 121-126.

The bank of receptacles 138 is attached to the front of the machine. The various juxtaposed receptacles 131-136 in bank 138 are separated by metal dividers or common walls 140. Glass or transparent plastic strips 142, at the front of each receptacle 131-136, permit observation of the number of electronic units 10 deposited in each receptacle.

Metal dividers 140 are grooved at 144 to guide slide doors 146 at the bottom of each receptacle 131-136, so that sorted electronic units 10 can be removed. Receptacles 131-136 have open ends 148 facing the path of travel of carrier 20, at stations 121-126 respectively, so that electronic units 10 in openings 22 in plate 20 can be deposited into receptacles 131-136 by blowing units 10 out of openings 22 into whichever receptacle 131-136 the units are properly sorted into according to the electronic measurements thereof at testing station 119.

Backing plate 80 is recessed at 150 in the area of sorting stations 121-126. When a file 24 with openings 22 is located at a station 121-126, it is faced by a row of nozzles 152. There is one nozzle for each opening in file 24. In the example given of 20 openings in each file 24, there would be twenty nozzles 152. There being six sorting stations 121-126, this would mean a total of one hundred and twenty nozzles to provide twenty nozzles at each of the six sorting stations. When a file of openings 20 is located at a sorting station, nozzles 152 are directed centrally at the flared mouths 48 of the openings, whereby air jetting from nozzles 152 is directed through mouths 48, through ports 46, to strike the units 10 in medial opening sections 44 to thereby eject units 10 from openings 22 and through receptacle openings 148 into receptacles 131-136.

Plate 80 has through openings or passageways 154 and threadedly engaged in the front ends of openings 154 are nozzles 152. Threadedly engaged in rear end of openings 154 are fittings 156 at the end of air tubes 158. In the example given, there are one hundred and twenty nozzles 152 but only one hundred and one air tubes 158, 160.

Station 126 is used to unload from plate 20 all electronic units 10 not sorted into other bins 131-135, and discharge can be handled somewhat differently by a control system that directs unloading of all units 10 remaining in openings 20 at station 126, rather than selecting particular openings 22 that have remaining units 10. A larger air tube 160 discharges into a housing 162 that services all nozzles 152 at station 126, i.e., there will be twenty passages 154 and twenty nozzles 152 at station 126 communicating with a single air housing 162.

To avoid a problem of excess air pressure feeding from a nozzle 152 to the wrong nearby opening 22, a through slot 164 in plate 80, coextensive with the length of files of nozzles 152, is provided alongside each file of nozzles 152.

Instead of ejecting capacitors or other units 10 from openings 22 in plate 20 by air ejected from nozzles 152, instead other means could be used to eject units 10 such as probes or pushers moved by subminiature air cylinders or by other mechanical ejection systems.

To give an example, bridges 186 and other controls 188 may be set as follows in the case of a capacitor with a desired capacitance value of 950-1050 pf (pico farad):
 (a) at the station 121 nozzles 152 eject units measured between 950 & 1050 pf (nominal group)
 (b) at station 122 nozzles 152 eject units measuring 1050 to 1100 pf (plus nominal)
 (c) at station 123 nozzles 152 eject units 10 measuring between 900 and 950 pf (minus nominal)
 (d) at station 124 nozzles 152 unload units measuring above 1100 pf (high and out of preferred range)
 (e) at station 125, nozzles 152 unload units 10 measuring below 900 pf (low and out of preferred range)
 (f) at station 126 nozzles 152 unload all remaining units 10 which may be dissipation factor rejects, or units that did not receive effective contact at the measuring station.

The settings 166 may be set to change the bridges 186 to vary the ranges. In FIG. 1 means 166 is shown to set what will happen at each station 121-126. Of course capacitors may vary in the pico farad (pf) range, in the nano farad (nf) range, or in the micro farad (uf) range. An example of a dissipation factor failure would be to discard all capacitors above the maximum df of 2.50 (2.5%). D.F. range may be adjusted from 0 to 9.99%. A unit is caused to fail when it exceeds the range setting.

Part of the air supply system is shown particularly in FIG. 14. A series of plenums 170 are shown and mounted on the plenums are a series of solenoids which control air exiting out of plenums 170 and into tubes 158. These are commercially available solenoid-controlled valves 172. One valve 172 is provided for each nozzle 152 at station 121-125. There is a common air supply to plenums 170 not shown. Solenoids 172 control air flow from plenums 170 to each tube 158 associated with each nozzle 152. In the example given of twenty openings 22 in a file 24 in plate 20, it would take twenty solenoids 172 to service a single file of nozzles 152. In the illustration of FIG. 14, the pair of plenums 170 at 174 supporting a full set of twenty solenoids 172, spaced in two rows, may be considered to be associated with sorting station 124. The set of plenums partly shown at 176 may be considered to be associated with station 123. The partly shown set of plenums at solenoids 178 on the right may be considered to be associated with station 125. The larger valve 180, associated with a large air supply tube 182, is associated with the large tube 160 feeding to air housing 162 at the last sorting station 126.

Wires 184 lead to solenoids 172, 180 to control their actions in controlling air supply to nozzles 152.

FIG. 15 is a block diagram illustrating the basic control circuitry of the machine. This figure schematically illustrates the carrier 20 with the units 10 under test already in the carrier and also shows some units already ejected after testing.

The first step in operating the machine is to manually insert the test value by suitable manual controls 166 into bridges 186 so that a comparison can be made of the units under test with a predetermined value inserted into each bridge network. During the automatic operation of the machine, the values of each of the units 10 are read by probes 90, 92 and the test results are fed into the bridges 186. A probe position sensor and switches 116, 118 automatically senses the position of the test probes and as there is a time lapse between the reading by the probes 90, 92 and the ejection of the units 10, control circuitry 188 is provided with a memory 190 which stores the compared test results until the tested units reach the place where the units are to be ejected by the solenoid operated air valves 172, 180 into the appropriate receptacles or bins 131–136. Control circuitry 188 with its system clock 192 functions to control the test probes positions and lining the stepping motor timing for moving the carrier, the operation of the bridges and memory, clocking the stored information out of memory and the operation of the solenoids for ejecting the test units into their respective bins. The components of the control circuitry, bridges, stepping motor and memory as well as other components, such as the solenoid operated air valves, are standard equipment readily available to those skilled in the art and no further description is deemed necessary herein.

Set forth below are some specifications used with prototypes of this equipment for testing of certain ranges of capacitors.

| Capacitor Test Specifications | | |
|---|---|---|
| Capacitance Test | | |
| Test Signal: | Frequency | one KiloHertz ± 1.0% |
| | Amplitude | .5V, .8V, 1.0V |
| Capacitance Range: | Range 1 | 10.–1099.99 pf |
| | Range 2 | .10–1.9999 nf |
| | Range 3 | 1.0–19.999 nf |
| | Range 4 | 10–199.99 nf |
| | Range 5 | .10–1.9999 uf |
| Capacitance Classifications: | 5 Bins: Plus Rejects Nominal cap range + Nominal − Nominal High Low Reject | |

| -continued Capacitor Test Specifications | |
|---|---|
| Capacitance Accuracy | ± .2% of Limit Setting ± 1 digit ± 1 pf |
| Dissipation Factor | |
| Test DF | 0.00 to 9.99% DF |
| Accuracy | ± 1% of Limit Setting ± 2 digits ± 150/c digits (where C = capacitance value in pf) |

| Mechanical Handler | |
|---|---|
| Feed Technique | Chip carrier plate, 800 parts per plate |
| Plate Loading | Vibration/Vacuum Loading Station |
| Chip Reservoir | Bulk Load Container for Loading Carrier Plates |
| Load Plate Tools | One required for each chip size None |
| Classification Bins | Five plus D.F. reject |

The system included everything needed to test up to 48,000 parts per hour with one operator, and is housed in a console measuring about 30 inches × 96 inches (72.2 × 244 CM).

In operation of the system, operation is initiated with a momentary switch after a loaded carrier 20 has been mounted on support 50. Then plate 20 is automatically advanced a step at a time by motor 76 until the end of the travel is reached when carrier 20 has passed the last sorting station 126. Return is automatic before removal of plate. In the course of travel of carrier 20 past electrical testing station 119 and past sorting stations 121–126, all electronic units 10 in openings 22 in plate 20 will have been tested and sorted by category into bins 131–136.

Having thus described my invention, I do not wish to be understood as limiting myself to the precise structure shown. Instead I wish to cover those modifications thereof which will occur to those skilled in the art upon learning of my invention and which properly fall within the scope of my invention.

I claim:

1. The method of testing and sorting miniature electronic units that are electrically conductive on opposite surfaces, such as capacitors and resistors to be tested for capacitance values, dissipation factor values, resistance values and the like, comprising:

(a) arranging said units in a bank of rows and files and advancing the bank past a first testing station and past subsequent sorting stations each successively aligned with each file of said bank and advancing said bank in a stepped manner in which movement is paused as each file of units reaches said testing station, (b) electrically testing according to values said units at said first testing station and classifying them in a plurality of ranges of values and, in testing said units, contacting a file of said units at a time by pressing a file of probes to one end of the file of units and contacting the other end of the file of units with a common conductive surface, and (c) locating a receptacle alongside each subsequent sorting station and at each subsequent sorting station collecting units belonging in one of said ranges of values by blowing them into the associated receptacle, and at the same time some files are being electrically tested at the testing station, collecting into the receptacles at the sorting stations units from other files previously tested at the testing station.

2. The method of testing and sorting miniature electronic units, comprising:
   (a) arranging said units in a bank of rows and files and advancing the bank past a first testing station and past subsequent sorting station each successively aligned with each file of said bank,
   (b) electrically testing according to values said units at said first testing station and classifying them in a plurality of ranges of values, and
   (c) at each subsequent sorting station collecting units belonging in one of said ranges of values.

3. In the method of claim 2, locating a receptacle alongside each subsequent sorting station and collecting said units by blowing them into the receptacles.

4. In the method of claim 2, in testing said units at said first testing station, contacting a file of said units at a time by pressing a file of probes to one end of the file of units and contacting the other end of said file of units with a common conductive surface.

5. In the method of claim 4, advancing said bank in a stepped manner and pausing movement of said bank as each file of units reaches said testing station, while the file of units is being electrically tested, and at the same time some files of units are being electrically tested at the testing station, collecting at the sorting stations units from other files previously tested at the testing station.

6. The method of testing values of and sorting according to values miniature electronic units having electrically conductive means on opposite surfaces, such as capacitors and resistors to be tested for capacitance values, dissipation factor values, resistance values and the like, comprising:
   (a) arranging said units in a planar bank in rows and files with said electrically conductive surfaces at opposite faces of said bank,
   (b) simultaneously electrically testing a file of said units at a time and continuing progressively from one side to the other side of said bank,
   (c) classifying tested values into a series of ranges and providing a receptacle for each range and providing a size of receptacle extending from end to end of said files,
   (d) providing relative motion between said receptacles and said bank so that each receptacle is successively aligned with each file starting at one side of said bank and ending at the other side of said bank, and
   (e) when each unit is aligned with a receptacle having a range of values including the value of that unit then depositing that unit in that receptacle.

7. In the method of claim 6, depositing each unit in the associated receptacle by applying air pressure to blow it into the receptacle.

8. In the method of claim 6, in electrically testing each file of units, contacting one set of conductive surfaces of the units with a common sheet of conductive material and pressing simultaneously a file of probes against the other set of conductive surfaces of the units.

9. Means to test values and to sort according to values miniature electronic units that are electrically conductive on opposite surfaces, such as capacitors and resistors to be tested for capacitance values, dissipation factor values, resistance values, and the like, comprising:
   (a) a conveyor and a planar carrier mounted on said conveyor and supported in an oblique plane thereby defining an upper carrier face and a lower carrier face and said conveyor being operative to convey said carrier in a generally horizontal path,
   (b) said carrier having a series of rows and files of openings to receive said units, first ends of said openings at said upper face of said carrier being of a size to pass said units for depositing of units into said openings and for removal of units from said openings, said carrier having a metal ply at the second ends of said openings having ports connected to said openings which are too small to pass said units whereby the units are retained from passing out of said openings from the lower face of said carrier,
   (c) electrical testing means including a file of electrical probes, matching each file of said openings, located at a first testing station in the travel of said carrier on said conveyor, said conveyor moving in a stepped manner pausing each time one of said files of openings reaches said testing station and means to press said probes into said openings at said testing station and said electrical testing means also being connected to said metal ply whereby each unit is in condition to be tested at said testing station because of being contacted by one of said probes at one end and by being contacted by said metal ply at its other end, and
   (d) a series of receptacles disposed along the path of travel of said carrier at sorting stations located after said testing station and proximate to said upper face of said carrier and each receptacle having an entry opening coextensive successively with the files of said openings as said carrier passes said sorting stations so as to be in a position to catch units discharged from said first ends of said openings and an air nozzle associated with each row of openings at each sorting station aligned with one of said receptacles whereby said units can be discharged from said openings into said receptacles by air pressure applied to said air nozzles.

10. Means to test values and to sort according to values miniature electronic units that are electrically conductive on opposite surfaces, such as capacitors and resistors to be tested for capacitance values, dissipation factor values, and resistance values, comprising:
    (a) a carrier having a multiplicity of openings to receive said units in a bank with the electrically conductive surfaces of the units directed toward opposite faces of the bank,
    (b) electrical testing means operative to conductively contact opposite surfaces of units in said carrier and to test values of the units, and
    (c) a plurality of receivers and transfer means to relatively move said carrier and said receivers so that each unit in said bank becomes aligned with each receiver and depositing means to selectively transfer units from said carrier to said receivers, whereby units may be deposited in said receivers according to test results from said testing means.

11. The subject matter of claim 10 in which said openings are disposed in rows and files and said carrier is planar.

12. The subject matter of claim 10 in which said carrier is disposed in an oblique plane thereby defining an upper carrier face and a lower carrier face, first ends of said openings at said upper face of said carrier being of a size to pass said units for depositing of units into said openings and for removal of units from said openings, second ends of said openings having means blocking said units from passing out of said openings from the lower face of said carrier, and said receivers having openings to receive units from said carrier facing the upper face of said carrier.

13. The subject matter of claim 12 in which said means blocking said units includes a metal ply at the second ends of said openings and said metal ply also being part of said electrical testing means by conductively contacting one of the electrically conductive surfaces of the units in said bank.

14. The subject matter of claim 13 in which said metal ply is ported at each opening and said depositing means including an air nozzle at each location of said carrier openings opposite said receivers which is directed from the lower face of said carrier to blow through the ports in said metal ply to propel units in said openings into said receivers.

15. The subject matter of claim 10 in which said transfer means includes a conveyor and said carrier being mounted on said conveyor and said conveyor being operative to convey said carrier in a generally horizontal path and said testing means being located at a testing station on said path and said receivers being located at sorting stations on said path and said openings in said carrier being arranged in rows and files and said conveyor operating in a stepped manner so that there is a pause in the travel of said carrier as each file of openings arrives at said testing station and at each sorting station.

16. The subject matter of claim 15 in which said testing means includes a file of electrical probes, including a probe for each opening in the files of openings, located at said testing station, said probes being connected to move together, and means to press said probes into each file of said openings at said testing station to conductively contact adjacent conductive surfaces of said units in the testing of said units.

17. The subject matter of claim 16 in which said carrier has a medial metal ply which contacts the other conductive surfaces of said units in the testing thereof, said carrier being recessed to expose said ply to at least one of said electrical probes whereby in testing said units both conductive surfaces thereof are connected to said testing means by said file of probes.

18. The subject matter of claim 16 in which said means to press said probes is an air cylinder connected thereto, there being control means to operate said transfer means and said testing means, and said control means including a first switch sensing the seating of said probes in contacting said units and including a second switch sensing the withdrawal of said probes.

19. The subject matter of claim 15 in which said depositing means includes an air nozzle associated with each row of openings at each sorting station forming files of nozzles aligned oppositely of said carrier to said receivers whereby said units can be discharged from said openings into said receivers by blowing air through said openings.

20. The subject matter of claim 19 in which said testing means classifies said units into ranges of values associated with each receiver and control means automatically operating said depositing means to blow each unit into the receiver associated with the range of values including the value of the unit when the unit reaches the sorting station of that receiver.

21. The subject matter of claim 19 in which each opening flares as it approaches the face of said carrier toward said air nozzles to thereby assist in directing air from said nozzles into said openings.

22. The subject matter of claim 19 in which there is a backing plate supporting said nozzles and said backing plate being recessed in the area of said nozzles to space the backing plate from said carrier and there being a relief slot between each file of nozzles extending through said backing plate to relieve air pressure to avoid air directed by a nozzle directed toward one opening in said carrier affecting units in another opening in said carrier.

23. The subject matter of claim 19 in which there is an air tube connected to each air nozzle and a common source of air and a solenoid controlled valve controlling flow of air from said common source to each air tube.

24. The subject matter of claim 23 in which there is control means controlling said testing means, said transfer means and said depositing means, said testing means classifying said units into ranges of values associated with each receiver, and said control means operating said solenoid controlled valves so that air will be applied to said air nozzles to blow each unit into the receiver associated with the range of values including the value of the unit when the unit reaches the sorting station of that receiver.

25. The subject matter of claim 19 in which said receivers are receptacles including housings to receive units, including transparent windows for observation of quantities of units therein, including bottom slide doors for unloading units, and including openings aligned with the path of travel of said carrier and coextensive with files in said carrier to receive units from said carrier.

26. The subject matter of claim 25 in which said receptacles are disposed in a juxtaposed bank and have common side walls between adjacent receptacles.

27. Means for supporting a multiplicity of miniature electronic units for testing, comprising:
(a) a planar carrier having a series of rows and files of openings of a size to contain said units,
(b) first ends of said openings at a first face of said carrier being of a size to pass said units for depositing of units into said openings and for removal of units from said openings, and
(c) a metal ply at the second ends of said openings and said ply having ports connected to said openings which are too small to pass said units whereby said units are retained from passing out of said openings from the second face of said carrier and whereby said units can be selectively ejected out of said openings from the first face of said carrier by means selectively applied to said ports and whereby units can be selectively electrically tested by pressing units against said ply to make electrical contact with a first end of the units and by making electrical contact with the second end of said units from the first face of said carrier.

28. The subject matter of claim 27 in which said carrier has series of plies including a non-conductive ply at the first face of said carrier and including the portion of said openings in which said units are disposed, including said metal ply which is located medially, including a non-conductive ply at the second face of said carrier, and including a metal ply at the second face of said carrier to shield units in said openings.

29. The subject matter of claim 28 in which said openings flare as they approach said second face of said carrier to assist in removing units from said opening by air jets directed at the second ends of said openings.

30. The subject matter of claim 29 in which said openings flare as they approach said first face of said carrier to assist in depositing units in said openings by vibration equipment.

31. The subject matter of claim 27 in which said openings are oblong in cross-section and the major axes of the oblong cross-sections are disposed obliquely to said rows and files whereby units can be received in said carrier which are too long in a major axis of oblong cross-section to be received in openings with the last-mentioned major axis aligned with rows or files.

32. Means for testing values of and sorting according to values miniature electronic units having electrically conductive surfaces on opposite ends, comprising:

a planar carrier disposed in an oblique plane with a series of rows and files of openings filled with said units and said openings being open to a first upper face of said carrier for deposit and removal of units therefrom, said openings being partly closed at the second lower face of said carrier to prevent escape of said units from said openings, electrical testing means at an area of electrical testing operative to conductively contact opposite ends of units in said opening and means to move said carrier from said area of electrical testing past a plurality of sorting areas and receivers at said sorting areas and means communicating with said openings at the second face of said carrier to apply means thereto to eject said units from said openings from said first face of said carrier into said receivers at said sorting areas.

33. A method of testing a multiplicity of electronic units comprising, grouping said units in a carrier, simultaneously connecting said units of a group individually to a voltage source, simultaneously measuring the electronic value of said units of the group and simultaneously comparing said measured electronic values of all units of the group sequentially with each of a plurality of different predetermined electronic values to determine the deviation of each unit from the predetermined values, and utilizing said deviations to selectively segregate said units according to their deviation from said predetermined values.

34. A system for testing a multiplicity of electronic units comprising, means for mounting said units in preselected groups, means for simultaneously connecting each unit of a preselected group to a voltage source to obtain an electronic value with respect to each unit, means for simultaneously comparing the electronic values of all units of the preselected group sequentially with each of a plurality of different predetermined electronic values to determine the deviation of each unit from the predetermined values, and means responsive to said deviations for segregating each of said units of the preselected group according to its deviation from said predetermined values.

* * * * *